United States Patent [19]

Ito et al.

[11] Patent Number: 4,842,945

[45] Date of Patent: Jun. 27, 1989

[54] STAINLESS STEEL COATED WITH THIN FILM OF CARBON CONTAINING SPECIFIED AMOUNT IN A STATE OF DIAMOND AND HAVING AN ADJUSTABLE BLACK TRANSPARENT COLOR TONE

[75] Inventors: Wataru Ito; Satoshi Ito, both of Kawasaki, Japan

[73] Assignee: Nippon Steel Corporation, Tokyo, Japan

[21] Appl. No.: 53,659

[22] Filed: May 26, 1987

[30] Foreign Application Priority Data

May 29, 1986 [JP] Japan ................................ 61-122215

[51] Int. Cl.$^4$ .......................... B05D 3/06; C23C 15/00
[52] U.S. Cl. .................... 428/457; 204/192.11; 204/192.15; 427/38; 427/39; 427/122; 428/408; 428/634
[58] Field of Search ........................ 428/457, 408, 634; 427/38, 39, 122; 204/192.11, 192.15

[56] References Cited

U.S. PATENT DOCUMENTS

| | | | |
|---|---|---|---|
| 4,434,188 | 2/1984 | Kamo et al. | 427/122 |
| 4,486,286 | 12/1984 | Lewin et al. | 204/192.11 |
| 4,490,229 | 12/1984 | Mirtich et al. | 204/192.11 |
| 4,495,044 | 1/1985 | Banks | 204/192.11 |
| 4,504,519 | 3/1985 | Zelez | 427/122 |
| 4,524,106 | 6/1985 | Flasck | 204/298 |
| 4,645,713 | 2/1987 | Shioya et al. | 428/457 |
| 4,647,512 | 3/1987 | Venkataramanan et al. | 428/39 |
| 4,663,183 | 5/1987 | Ovshinsky et al. | 427/39 |
| 4,707,384 | 11/1987 | Schachner et al. | 428/408 |
| 4,725,345 | 2/1988 | Sakamoto et al. | 427/38 |

OTHER PUBLICATIONS

Suzuki et al, Appl. Phys. Letts., 50 (1987), 728.
Zarowin et al, Appl. Phys. Letts., 48 (1966) 759.
Antilla et al, Thin Solid Films, 136 (Feb. 1966), 129.

Primary Examiner—Upendra Roy
Attorney, Agent, or Firm—Pollock, Vande Sande & Priddy

[57] ABSTRACT

A stainless steel with black transparent appearance suitable for use as a decorative architectural material. The stainless steel material has a stainless steel substrate and a thin graphite film formed on the substrate, the thin graphite film having a thickness not greater than 1 μm and containing 10 to 75 wt % of carbon existing in a state of diamond. This stainless steel material is produced by chemical vapor deposition process making use of a capacitance-coupled type high-frequency plasma, having the steps of preparing a stainless steel material as a substrate; placing the substrate in an atmosphere of a mixture gas which contains both hydrogen gas and an inert gas together with a hydrocarbon gas; and causing a reaction by applying a D.C. voltage of 100 to 600 V using the substrate as a cathode; thereby forming, on the substrate, a thin graphite film having a thickness not greater than 1 μm and containing 10 to 75 wt % of carbon existing in a state of diamond.

9 Claims, 3 Drawing Sheets

STAINLESS STEEL COATED WITH THIN FILM OF CARBON CONTAINING SPECIFIED AMOUNT IN A STATE OF DIAMOND AND HAVING AN ADJUSTABLE BLACK TRANSPARENT COLOR TONE

BACKGROUND OF THE INVENTION

The present invention relates to a stainless steel which has a graphite thin film containing carbon existing in a state of diamond (hereinafter described as "diamond carbon"), suitable for use in decorating purpose and for use as corrosion-resisting materials such as architectural materials and automobile materials, and also to a method of producing such a stainless steel material by making use of chemical vapor deposition.

In general, stainless steels have wide use as architectural facings and interior finishes because of their attractive appearance. In recent years, there is an increasing demand not only for stainless steel materials having native surfaces but also for stainless steel materials having specific colors for decorating purposes.

Hitherto, various wet coloring methods have been proposed for coloring stainless steel, such as so-called INCO coloring method. Stainless steel materials processed by such wet-type methods, however, tend to exhibit color fading, discoloration and decoloration, as well as deterioration in weatherability, during long use. This drawback seems to be attributable to the presence of moisture content included during the coloring process. In addition, the stainless steels processed by this type of method are liable to be scratched easily, thus exhibiting inferior wear resistance.

Recently, it has been desired to obtain variation regarding each color, for example, to obtain a deep black color tone having transparent feeling. Although it became possible to obtain black color appearance by improving a prior art method, it is a single usual black color, that is, it had not been able to obtain various black colors or to obtain various black color surfaces having improved weatherability and wear-resisting property.

Technology for synthesizing bulky diamonds under high pressure and temperature has been developed and put into use in industrial scale in the 1960's. Technology for synthesizing thin diamond film, however, is rather new as compared with the synthesis of bulky diamonds. The synthesis of thin diamond film, which pertains to synthesis of diamonds in graphite stable region, belongs to a very interesting field from an academic point of view. In addition, synthesized thin diamond film has a potential for allowing various advantageous features of diamond t be utilized in various technological and industrial fields. Nowadays, studies are made for developing processes for synthesizing diamond thin films in various fields such as material industries, e.g., coating of cutting tools, semiconductor industries, e.g., semiconductor devices and heat-dissipating substrates of semiconductor devices, acoustic technologies, e.g., diaphragms of speakers, and optical technologies. Attempts and proposals for utilization of diamond thin films are disclosed, for example, in Japanese Unexamined Patent Publication No. 232991/1984.

Actually, however, such attempts and proposals are successfully put into practical use only in limited fields such as partial coating of tool materials and acoustic engineering in which a small area is coated, because of difficulty encountered in forming thin films of diamond. It is to be pointed out also that these attempts and proposals are intended only for the production of thin film having 100% diamond content, and there are very few attempts intended for forming thin films to which the invention pertains, i.e., films containing both diamond carbon and graphite, as shown in Japanese Unexamined Patent Publication No. 65796/1985. In the prior art of the Japanese Unexamined Patent Publication No. 65796/1985 there is disclosed a hard carbon film comprising diamond of hexagonal system and graphite, however, in the Publication there is disclosed no teaching regarding the ratio of diamond to graphite. Further, in the Japanese Unexamined Patent Publication No. 65796/1985, the hard carbon film is intended to be used as a sliding part mounted in machine or as cutting tools, and the thin film is described to have high hardness, wear-resisting property and lubrication property, however, there is no description regarding decoration property and more particularly regarding color. In this Japanese Publication, regarding a method of producing the thin film, there is disclosed only a method of chemical vapor deposition by using D.C. plasma of thermionic emission type, in which method there has been such a drawback that a good film is obtainable regarding only a small area in a case of using the chemical vapor deposition using D.C. plasma of the thermionic emission type. In addition, there is no disclosure regarding the ratio of diamond to graphite in this Japanese Publication.

Further, it has also been proposed to make use of amorphous carbon thin film for decorating purposes, as disclosed in U.S. Pat. No. 4,524.106. The art shown in this Patent, however, cannot provide transparent black color tone, although it provides a single color approximating pure black. In addition, the single black color film formed by this art is still unsatisfactory in that it has only insufficient hardness, although it exhibits superior weatherability and, therefore, this art has not been put into practical use.

In the prior art, the coating of a sliding part used in a machine or of a cutting tool with diamond carbon has high hardness and wear resistance. However, when using the coating as the surface of a decorative material, it has been desired to have a stainless steel with various color tones even in a case of a black color and more particularly black color having both transparent feeling and various degree of the transparent feeling, instead of conventional single black color tone. In addition, it has been desired to obtain a method of producing a diamond carbon film of a large area and of making it possible to control the ratio of generated diamond carbon and graphite.

The present invention makes it possible to simultaneously and quantitatively form a film of a mixture of graphite and diamond carbon on a surface of stainless steel to thereby obtain a black transparent film which has not hitherto existed and to thereby make the degree of the transparency variable to a desired level. Further, since the film has a hardness value approximating to that of diamond, the film has a superior resistance to being damaged.

SUMMARY OF THE INVENTION

Accordingly, an object of the present invention is to provide a stainless steel on which is formed a black transparent thin film of a mixture of diamond carbon and graphite, which thin film can improve the shortcomings inherent in the prior art.

Another object of the invention is to provide a method which enables a functional thin film to be formed on a stainless steel, thereby overcoming the above-described problems of the prior art.

To this end, according to one aspect of the present invention, there is provided a stainless steel with black transparent appearance comprising a stainless steel substrate and a thin graphite film formed on the substrate, the thin graphite film having a thickness not greater than 1 μm and containing 10 to 75 wt % of diamond carbon.

According to another aspect of the present invention, there is provided a method of producing a stainless steel having black transparent appearance by chemical vapor deposition process making use of a capacitance-coupled-type high-frequency plasma, comprising: preparig a stainless steel material as a substrate; placing the substrate in an atmosphere of a mixture gas which contains both hydrogen gas and an inert gas together with a hydrocarbon gas; and causing a reaction by applying a D.C. voltage of 100 to 600 V using the substrate as a cathode; thereby forming, on the substrate, a thin graphite film having a thickness not greater than 1 μm and containing 10 to 75 wt % of diamond carbon.

In a stainless steel used as a decorative material, it is necessary to make it possible to control various delicate color tones by repeatedly controlling color tone, in addition to the properties of high hardness and wear resistance both obtained by diamond carbon. In addition, when used as an architectural facing exposed in rain and wind or used as architectural interior finish, it is necessary to have weatherability and somewhat good workability.

In the present invention, the delicate control of the degree of transparent feeling is achieved by controlling the ratio of the generated diamond carbon to graphite. In roughly sorting the degree of transparent feeling in judging from appearance, there are observed three levels, that is, a first level having a ratio of diamond carbon to graphite of 10 to 30%, a second level having the ratio of 30 to 50%, and a third level having the ratio of 50 to 75%.

When the content of the diamond carbon in the graphite thin film of the invention is less than 10%, the desired hardness and, hence, desired wear resistance cannot be obtained. Conversely, when the content of the diamond carbon grains exceeds 75%, the superior light-transmitting property of the diamond becomes too remarkable, making it difficult to obtain the desired black transparent appearance of the product.

A stainless steel used as an architectural material or a material for automobile which stainless steel is desired to have black transparent appearance contains diamond carbon of 10 to 75%, and in compliance with user's preference regarding color tone it is possible to select one of the three levels of the ratio of diamond carbon to graphite to meet the desire of a user.

The stainless steel having the black transparent appearance is at first used as an architectural facing exposed to rain and wind such as, for example, materials for roof and an outer wall of an architecture, a facing for automobile, a gate, and an outer wall or an entrance door for a garage. A next important use thereof is a material for automobile for producing parts such as a molding, a muffler and an ornament. Further, architectural facing and interior finish is one of a great use, which facing means a material for constituting the outer part of an architecture which outer part is exposed to rain and wind and which outer part includes, for example, a roofing, an outer wall and stairs, while the interior finish means a material used in the interior of an architecture, which interior finish includes a flooring, an inner wall material, a ceiling and a door material.

The thickness of the thin graphite film containing diamond carbon preferably is not greater than 1 μm. A greater film thickness will cause the film to exhibit characteristics as a bulk, making it difficult processing such as bending, cutting and so on.

The method of the invention is a chemical vapor deposition method using high frequency plasma of a capacity-coupled type, in which method a stainless steel is connected to a cathode of D.C. voltage for plasma in an atmosphere of a mixture gas containing hydrocarbon gas, hydrogen gas and inert gas, all of the factors of substrate temperature, high frequency output for plasma, and D.C. voltage being selected to have specific range so that the ratio of generated diamond carbon to generated graphite has a desired value.

The existence of diamond carbon in a thin graphite film is measured by using Raman spectrum of the thin film formed on a surface of stainless steel, and the ratio of the diamond carbon to graphite is obtained by taking the absorption characteristics thereof regarding the diamond carbon and graphite into account.

The hydrocarbon gas employed in the method of the invention has a wide selection. Namely, it can be selected from among chain, ring, unsaturated and aromatic hydrocarbons including methane, neopentane, cyclohexane, acetylene, benzene and so forth. The inert gas used may be an ordinary one such as argon, helium or the like.

The control of the film thickness may be conducted by monitoring the film forming speed through continuous measurement of electric characteristics with the aid of a monitoring quartz plate placed in a chamber which accommodates a stainless steel substrate in a production apparatus which will be explained later. The measurement of the thickness of the film formed on the stainless steel may be measured by means of ellipthometry.

It is to be noted also that, according to the present invention, the D.C. voltage is applied such that the stainless steel plate as the substrate constitutes a cathode while negative potential is applied to the substrate. This ensures a superior bonding between the substrate and the coating film. This in turn enables the method of invention to any type of stainless steel, regardless of the kind of a stainless steel material, nature of the material surface and the configuration of the material.

According to the invention, the coating film may be formed directly on the stainless steel surface which has metallic luster inherent in stainless steels. This, however, is not exclusive and the film may be formed after coating a stainless steel material with a suitable material such as ceramics having specific colors such as TiN. In such a case, the thin coating film in accordance with the invention, formed on the primary coating film, provides various color tones deepened by black color tone, thus enhancing decorative effect without impairing the weatherability and wear resistances of the material surface.

In general, formation of a uniform thickness on a flat substrate with substantial area can be suitably formed by chemical evaporation deposition process which makes use of capacitance-coupling-type high-frequency plasma. The present invention will be understood from the description of the embodiments taken in conjunction with the accompanying drawings.

DESCRIPTION OF THE PREFERRED EMBODIMENT

Figure 1:
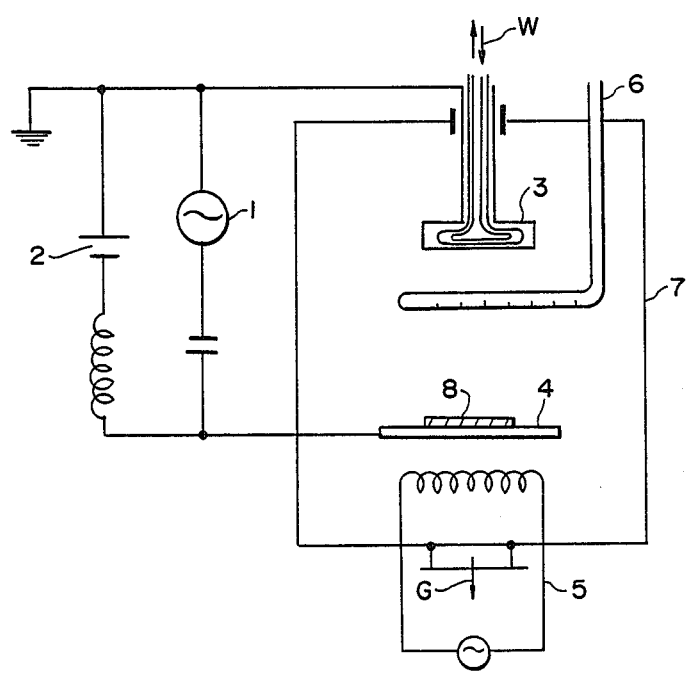
FIG. 1 is a schematic illustration of an apparatus which is suitable for use in a method embodying the present invention.

Referring first to FIG. 1, an apparatus for use in a method embodying the present invention has a high-frequency power supply 1 and another power supply 2 which is a constant-voltage or constant-current D.C. power supply. Arrangment is made such that both the power supplies can apply voltages simultaneously on the same electrodes, by an assist of a filter.

In operation, the material gas is ionized by a high-frequency plasma. The ions thus formed are accelerated as the D.C. voltage is added to a sheath voltage (self-bias voltage) applied between the electrodes, so that a film of a high quality, which can never be attained by the high-frequency plasma alone, is formed on the substrate 8 which is a stainless steel member.

The electrode 3 is made of a material having high levels of heat resistance and electrical conductivity, such as a stainless steel, and is provided therein with water-cooling means. The electrode 3 is movable up and down while being electrically insulated from the wall of the chamber 7 so that the electrodes spacing is variable linearly.

The other electrode 4, which is disposed adjacent to the substrate 8, is made of a material having high levels of heat and electrical conductivities. The electrode 4, therefore, can efficiently transmit heat delivered by an underlying heater 5.

In order to fully make use of the ion accelerating effect explained above, the electrode 3 is grounded while a high-frequency potential and a D.C. negative potential are applied to the electrode 4 adjacent to the substrate.

Meanwhile, a mixture reaction gas composed of a hydrocargbon gas, hydrogen gas and an inert gas is introduced into the chamber through a reaction gas introduction pipe 6 so as to uniformly fill the chamber. The mixing ratio or composition of the reaction gas is controlled by means of a gas flow controller. The illustrated arrangement for introducing the reaction gas is only illustrative and the arrangement may be modified such that the anode also serves as a gas inlet port.

The composition of the reaction gas which forms the atmosphere in the chamber is closely related to the formation of the thin film. An increased hydrogen gas content will cause the graphite to be preferentially etched in the thin film containing both graphite and diamond carbon, with the result that the content of the diamond carbon in the thin film is increased. The inert gas brings about an increased film forming speed due to sensitizing effect which promotes decomposition of hydrocarbon. The hydrocarbon gas content in the mixture reaction gas preferably ranges between 0.5 vol % and 10 vol %. When the content is less than 0.5 vol %, the film forming speed is impractically low, whereas a content exceeding 10% will cause the film forming speed to be increased excessively with a result that the preferential etching of graphite by the hydrogen gas is substantially impaired. It is thus possible to control the film composition and the film forming speed by mixing hydrogen gas and inert gas at suitable ratios in the mixture reaction gas.

Examples of conditions under which the method of the invention can suitably be carried out will be explained hereinunder with reference to FIG. 2.

Figure 2:
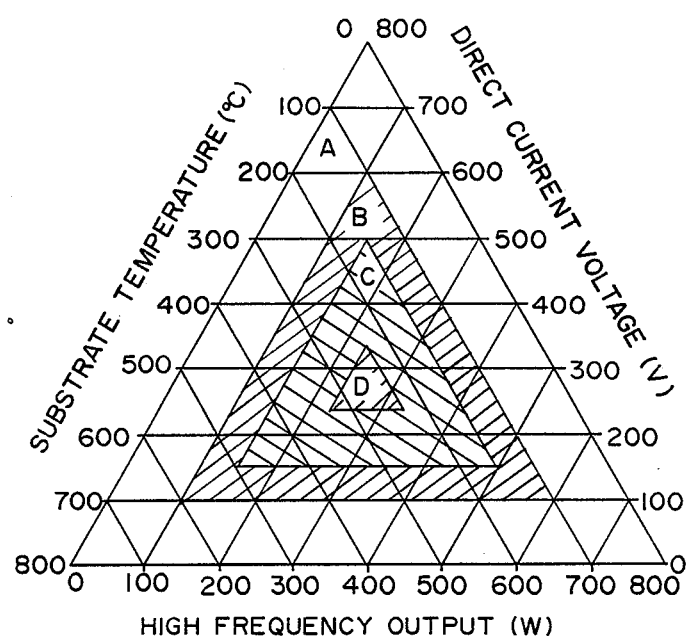
FIG. 2 is a graph illustrating influences of various production factors on the diamond carbon grain content in a thin film.

FIG. 2 is obtained by repeating experiments on the basis of Working Example 1 described hereinafter. That is, FIG. 2 shows the influences of factors such as the substrate temperature (°C.), high-frequency output (w) and the D.C. voltage (V) on the diamond carbon content in the thin film which is formed with a mixture reaction gas containing 1 vol % of methane gas diluted by a 1:1 mixture of hydrogen gas and an inert gas. It is to be noted, however, that the quality of the film is slightly changed by other parameters such as electrodes spacing, partial pressures of the gases and so forth. In FIG. 2, a symbol A represents a region in which the film does not materially contain diamond carbon, i.e., a region in which almost whole of the thin film is constituted by amorphous carbon or graphite. A symbol B represents a region in which the thin film has a diamond carbon content less than 10%. A symbol C represents a region in which the thin film has a diamond carbon content ranging between 10% and 75%. Finally, a symbol D represents a region in which the thin film has a diamond carbon grain content exceeding 75%. Of course, it is possible to subdivide the region (C) into parts such as, for example, 10 to 30%, 30 to 50%, and 50 to 75% and etc. regarding the diamond carbon content. The contents of graphite and diamond carbon are calculated from absorption characteristics obtained through Raman spectral measurement.

The substrate temperature during the processing is preferably maintained at a level not lower than 100° C. but not higher than 600° C., more preferably not lower than 150° C. but not higher than 500° C. When the substrate temperature is below 100° C., the effect of the preferential etching of graphite by the hydrogen gas is not appreciable, possibly due to low probability of generation of the diamond carbon. With such a low substrate temperature, therefore, it is quite difficult to obtain a thin film having the desired properties. On the other hand, substrate temperature above 600° C. is unnecessary and heating to such a high temperature causes a risk for the generated diamond carbon to be changed into graphite.

In order to obtain a thin film having the desired properties, the high-frequency power is preferably greater than 150W but not greater than 500W, because the small high-frequency power less than 100W contributes only to the formation of amorphous carbon or graphite.

The D.C. voltage is necessarily not lower than 100W but not higher than 600V. When the voltage is below 100V, it is not possible to obtain the desired graphite film containing diamond carbon, whereas a high D.C. voltage exceeding 600V will unstabilize the high-frequency plasma, resulting in a damage on the film. In order to obtain a thin film which imparts a black transparent appearance, the D.C. voltage should be selected to be not lower than 150V but not higher than 500V.

A test for weatherability is effected by exposure to atmospheric air while applying an aqueous solution of 3.5% NaCl three times per one day in a period of one week, the degree of resultant rust being evaluated by sorting into five levels. Further, the color tones of black color is evaluated by a degree of a color difference between an actual color and black color, which degree of color difference is defined by the following equation:

$$\Delta E = (L^{*2} + a^{*2} + b^{*2})^{\frac{1}{2}}$$

wherein the values of L*, a*, b* are measured by use of a conventional color differentiator. The values of L*, a*, and b* are ones obtained by compensating scattered light issued from a sample so as to match it to the sense of sight of a human being, the degree of separation of color in comparison with a standard color ($L_0^*$, $a_0^*$ and $b_0^*$) being evaluated by the following equation:

$$\Delta E = \{(L^* - L_0^*)^2 + (a^* - a_0^*)^2 + (b^* - b_0^*)2\}^{\frac{1}{2}}.$$

In the equation, the value of L* shows brightness, the values of both the a* and b* showing color tones. For example, a pure black color is shown by L*=0, a*=0 and b*=0, while a pure white color is shown by L*=100, a*=0 and b*=0. Thus, in a case where a standard color is a pure black color (L*=0, a*=0, and b*=0), the above-described equation, $\Delta E = \{L^{*2} + a^{*2} + b^{*2}\}^{1/8}$, is obtained.

Figure 3:
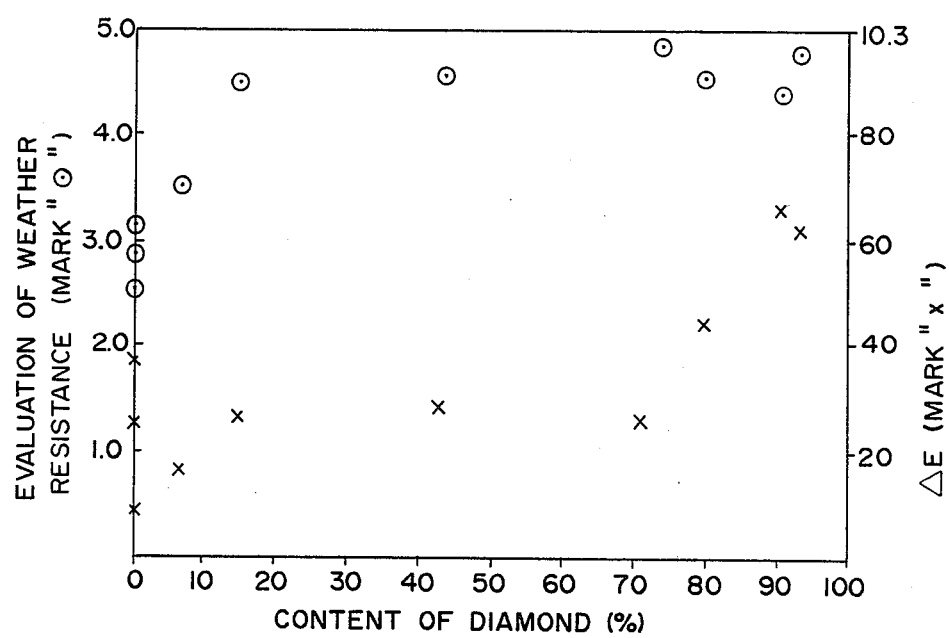
FIG. 3 is a graph showing evaluation of weather resistance and a degree of color difference between a color obtained and black color when the ratio of diamond carbon to graphite both generated in a thin film formed on a stainless steel is varied.

The evaluation test of the weatherability and the degree (ΔE) of color difference set on the basis of black color by use of a color differentiator are effected regarding samples prepared by forming thin films on stainless steel which films have various diamond contents (, that is, the ratio of generated diamond carbon to generated graphite), the results of the tests being shown in FIG. 3.

In the drawings, the mark "⊙" indicates an evaluation of weatherability, the mark "X" showing the value of ΔE.

In FIG. 3 it can be seen that a range of the diamond content capable of meeting good weatherability and a black color tone having transparent feeling both required in a stainless steel for decoration is in a range of 10 to 75%. If the diamond content is less than 10%, the evaluation of weatherability becomes inferior and transparent feeling is scarcely obtained regarding color tone. On the other hand, if the diamond content exceeds 75%, the transparent feeling is too predominant to obtain reposeful feeling.

A working example of the method in accordance with the present invention will be explained hereinunder.

EXAMPLE 1

The interior of the chamber of the apparatus shown in FIG. 1 was evacuated to a level of $10^{-5}$ Torr, and the stainless steel member (100×100 mm square) used as a substrate was heated to and maintained at 300° C. by means of resistor heating device 5. Then, a reaction gas containing 1% of methane and 99% of 1:1 mixture gas of hydrogen and argon was introduced into the chamber through the introduction pipe 6 at a rate of 100 SCCM while the pressure of the gas atmosphere was maintained at the level of 0.5 Torr. Then, the voltages were applied between the electrodes simultaneously by the high-frequency power supply (300W) and the constant-voltage power supply (300V), thus processing the substrate for 30 minutes.

The formed thin film was subjected to a structure analysis of carbon conducted through Raman spectrum. Evaluation of spectral characteristics, hardness test and weatherability test were also conducted. It was confirmed that the thus formed thin film has a thickness of 0.18 μm and diamond carbon content of 42%, as well as sufficient hardness and a visual characteristic which imparted black transparent appearance (the values of L*, a* and b* being 27.8, 2.7 and 5.3, respectively) to the surface of the stainless steel substrate. Also, in the weatherability test there was shown a very good result, that is, a value of 4.6.

COMPARISON EXAMPLE 1

A thin film was formed under the same conditions as Example 1 described above, using a mixture gas composed of 1% of methane and 99% of argon. In this case, the film forming speed was as high as 200 Å/min. The film, however, showed inferior luster though it showed black color (the value of L*, a* and b* being 19.7, 9.5 and 12.4, respectively). The hardness also was low. The value of the weatherability was reduced to 3.2. The result of an analysis conducted through Raman spectrum showed that no diamond carbon was generated.

COMPARISON EXAMPLE 2

A thin film was formed under the same conditions as Example 1 described above, using a mixture gas composed of 1% of methane and 99% of hydrogen. The film thus formed was transparent but colorless (the value of L*, a* and b* being 65.3, −1.2 and 7.5, respectively), although the hardness was appreciably high. The film forming speed also was as low as several Å/min which is quite impractical.

EXAMPLE 2

A thin film was formed under the conditions of 300° C. regarding a substrate temperature, 350W regarding high frequency output, and 150v regarding D.C. voltage. The generated thin film is 0.21 μm in film thickness. Although the film-forming speed was increased to 70 Å/min, it was confirmed by Raman spectrum analysis that the ratio of diamond carbon was reduced to 14%, with the result that the hardness of the thin film was also reduced, however, the level of the hardness was still high. Further, there were seen superior results of weatherability (the value thereof being 4.5) and of decoration property (the values of L*, a*, b* being 22.4, 7.3 and 11.2, respectively). This example is applicable to a field in which production efficiency is important.

EXAMPLE 3

A thin film was formed under the conditions of 300° C. regarding a substrate temperature, 250W regarding high frequency output, and 250V regarding D.C. voltage. A thickness of the generated thin film and a film-forming speed was reduced to 0.11 μm and 36 Å/min, respectively, however, the contents of diamond carbon generated in the film was increased up to 71% with the result that there was obtained a thin film having very high hardness without impairing decoration property (the values of L*, a* and b* being 25.5, 4.1 and 2.2, respectively). Also, in a weatherability test there was shown a superior value of 4.8.

As will be understood from the foregoing description, the present invention makes it possible to obtain a stainless steel material of back transparent appearance superior in both weatherability and wear-resistant property which material could never be obtained by prior arts. The film can be obtained with uniform thickness over a substantial area of the substrate, at a sufficiently high film-forming speed, without requiring any complicated production apparatus.

Thus, the present invention offers a novel decorative stainless steel which has wide uses in various fields, that is, uses for architectural facings, interior finishes and materials for automobiles.

It is to be understood also that the film formed by the method of the invention does not substantially impede processing on the stainless steel substrate such as spot welding because the film is made of a mixture of diamond carbon and graphite.

What is claimed is:

1. A stainless steel with black transparent appearance comprising a stainless steel substrate and a thin film formed on said substrate, said thin film having a thickness not greater than 1 $\mu$m and consisting of graphite and 10 to 75 wt % of carbon existing in a state of diamond. of diamond.

2. A stainless steel with black transparent appearance as set forth in claim 1, said stainless steel being a facing material.

3. A stainless steel with black transparent appearance as set forth in claim 1, said stainless steel being a material for automobiles.

4. A stainless steel with black transparent appearance as set forth in claim 1; said stainless steel being a material for an architectural facing or interior finish.

5. A stainless steel with black transparent appearance as set forth in claim 1, said thin film containing 10 to 50 wt % of carbon existing in a state of diamond.

6. A stainless steel with black transparent appearance as set forth in claim 1, said thin film containing 10 to 30 wt % carbon existing in a state of diamond.

7. A stainless steel with black transparent appearance as set forth in claim 1, said thin film containing 30 to 75 wt % carbon in a state of diamond.

8. A stainless steel with black transparent appearance as set forth in claim 1, said thin film containing 50 to 75 wt % carbon existing in a state of diamond.

9. A stainless steel with black transparent appearance as set forth in claim 1, said thin graphite film containing 30 to 50 wt % carbon existing in a state of diamond.

* * * * *